US009378947B2

(12) United States Patent
Britt et al.

(10) Patent No.: US 9,378,947 B2
(45) Date of Patent: Jun. 28, 2016

(54) BUFFER LAYER DEPOSITION FOR THIN-FILM SOLAR CELLS

(75) Inventors: Jeffrey S. Britt, Tucson, AZ (US); Scot Albright, Tucson, AZ (US); Urs Schoop, Tucson, AZ (US)

(73) Assignee: Hanergy Hi-Tech Power (HK) Limited, West KL (HK)

( * ) Notice: Subject to any disclaimer, the term of this patent is extended or adjusted under 35 U.S.C. 154(b) by 361 days.

(21) Appl. No.: 13/273,013

(22) Filed: Oct. 13, 2011

(65) Prior Publication Data

US 2012/0034726 A1     Feb. 9, 2012

Related U.S. Application Data

(63) Continuation of application No. 12/397,846, filed on Mar. 4, 2009, now Pat. No. 8,062,922.

(60) Provisional application No. 61/068,459, filed on Mar. 5, 2008.

(51) Int. Cl.

| H01L 31/18 | (2006.01) |
| H01L 21/02 | (2006.01) |
| C23C 18/12 | (2006.01) |
| H01L 31/032 | (2006.01) |
| H01L 31/0392 | (2006.01) |
| H01L 31/0749 | (2012.01) |

(52) U.S. Cl.
CPC ...... *H01L 21/02425* (2013.01); *C23C 18/1204* (2013.01); *C23C 18/1283* (2013.01); *H01L 21/02422* (2013.01); *H01L 21/02485* (2013.01); *H01L 21/02551* (2013.01); *H01L 21/02568* (2013.01); *H01L 21/02614* (2013.01); *H01L 21/02628* (2013.01); *H01L 31/0322* (2013.01); *H01L 31/0392* (2013.01); *H01L 31/0749* (2013.01); *Y02E 10/541* (2013.01)

(58) Field of Classification Search
None
See application file for complete search history.

(56) References Cited

U.S. PATENT DOCUMENTS

| 3,148,084 A | 9/1964 | Hill et al. |
| 4,043,296 A | 8/1977 | Chu et al. |
| 4,143,235 A | 3/1979 | Duisman |
| 4,204,933 A | 5/1980 | Barlow et al. |
| 4,366,337 A | 12/1982 | Alessandrini et al. |

(Continued)

FOREIGN PATENT DOCUMENTS

| JP | H07133102 A | 5/1995 |
| JP | 2003-249673 A | 9/2003 |

(Continued)

OTHER PUBLICATIONS

Tsui et al., "Techniques for Combinatorial Molecular Bean Epitaxy", Review of Scientific Instruments, May 18, 2005, 5 pages, vol. 76, issue 6, article 062206.

(Continued)

*Primary Examiner* — Fernando L Toledo
*Assistant Examiner* — Valerie N Newton
(74) *Attorney, Agent, or Firm* — Kolisch Hartwell, P.C.

(57) ABSTRACT

Improved methods and apparatus for forming thin-film buffer layers of chalcogenide on a substrate web. Solutions containing the reactants for the buffer layer or layers may be dispensed separately to the substrate web, rather than being mixed prior to their application. The web and/or the dispensed solutions may be heated by a plurality of heating elements.

17 Claims, 6 Drawing Sheets

(56) References Cited

U.S. PATENT DOCUMENTS

| | | | |
|---|---|---|---|
| 4,642,140 | A | 2/1987 | Noufi et al. |
| 4,673,801 | A | 6/1987 | Leary et al. |
| 4,778,478 | A | 10/1988 | Barnett |
| 5,112,410 | A | 5/1992 | Chen |
| 5,396,080 | A | 3/1995 | Hannotiau et al. |
| 5,578,502 | A | 11/1996 | Albright et al. |
| 6,109,912 | A | 8/2000 | Robinson et al. |
| 6,268,014 | B1 | 7/2001 | Eberspacher et al. |
| 6,281,098 | B1 | 8/2001 | Wang et al. |
| 6,310,281 | B1 | 10/2001 | Wendt et al. |
| 6,350,489 | B1 | 2/2002 | Moriyama et al. |
| 6,372,538 | B1 | 4/2002 | Wendt et al. |
| 6,417,027 | B1 | 7/2002 | Akram |
| 6,428,851 | B1 | 8/2002 | Friedersdorf et al. |
| 6,537,845 | B1 | 3/2003 | McCandless et al. |
| 7,172,793 | B2 | 2/2007 | Cohu |
| 7,194,197 | B1 | 3/2007 | Wendt et al. |
| 7,306,823 | B2 | 12/2007 | Sager et al. |
| 7,393,516 | B2 | 7/2008 | Seo et al. |
| 8,062,922 | B2 * | 11/2011 | Britt et al. .............. 438/95 |
| 2002/0159019 | A1 | 10/2002 | Pokorny et al. |
| 2003/0059526 | A1 | 3/2003 | Benson et al. |
| 2003/0082834 | A1 | 5/2003 | Delahoy |
| 2003/0142169 | A1 | 7/2003 | Maeng et al. |
| 2004/0067321 | A1 | 4/2004 | Kondo et al. |
| 2005/0115502 | A1 | 6/2005 | George et al. |
| 2005/0158909 | A1 | 7/2005 | Milliron et al. |
| 2005/0271827 | A1 * | 12/2005 | Krunks et al. ............ 427/446 |
| 2005/0278163 | A1 | 12/2005 | Poplack et al. |
| 2006/0019333 | A1 | 1/2006 | Rodgers et al. |
| 2006/0019427 | A1 | 1/2006 | Cao |
| 2006/0062902 | A1 | 3/2006 | Sager et al. |
| 2006/0096537 | A1 | 5/2006 | Tuttle |
| 2006/0163207 | A1 | 7/2006 | Lee et al. |
| 2006/0278163 | A1 | 12/2006 | Ovshinsky et al. |
| 2007/0110836 | A1 | 5/2007 | Fork et al. |
| 2007/0122936 | A1 | 5/2007 | Park et al. |
| 2007/0166453 | A1 | 7/2007 | Van Duren et al. |
| 2007/0169809 | A1 * | 7/2007 | Van Duren et al. .......... 136/262 |
| 2007/0227633 | A1 | 10/2007 | Basol |
| 2007/0243657 | A1 | 10/2007 | Basol et al. |
| 2007/0253686 | A1 | 11/2007 | Wendt et al. |
| 2008/0153268 | A1 | 6/2008 | Johnston et al. |
| 2008/0175982 | A1 | 7/2008 | Robinson et al. |
| 2008/0213467 | A1 | 9/2008 | Yu et al. |
| 2008/0300323 | A1 | 12/2008 | Caldwell et al. |
| 2009/0077805 | A1 | 3/2009 | Bachrach et al. |
| 2009/0120359 | A1 | 5/2009 | Roussillon et al. |
| 2009/0301550 | A1 | 12/2009 | Hunt et al. |
| 2009/0305449 | A1 | 12/2009 | Bollman et al. |
| 2010/0087015 | A1 | 4/2010 | Britt et al. |

FOREIGN PATENT DOCUMENTS

| | | | |
|---|---|---|---|
| JP | 2004-158561 | A | 6/2004 |
| JP | 2007-160304 | A | 6/2007 |
| JP | 2009528680 | A | 8/2009 |
| WO | 2005086238 | A1 | 9/2005 |
| WO | WO2007101099 | A2 | 9/2007 |
| WO | 2009111052 | A1 | 9/2009 |
| WO | 2009111053 | A2 | 9/2009 |
| WO | 2009111055 | A1 | 9/2009 |

OTHER PUBLICATIONS

US Receiving Office, International Search Report and Written Opinion of the International Searching Authority, in PCT/US2009/01429, Jun. 17, 2009, 7 pages.

US Receiving Office, International Search Report and Written Opinion of the International Searching Authority, in PCT/US2009/01432, Jun. 19, 2009, 7 pages.

US Receiving Office, International Search Report and Written Opinion of the International Searching Authority, in PCT/US2009/001427, Jun. 25, 2009, 6 pages.

US Receiving Office, International Preliminary Report on Patentability, in PCT/US2009/001427, Sep. 7, 2010, 5 pages.

US Receiving Office, International Preliminary Report on Patentability, in PCT/US2009/01429, Sep. 7, 2010, 6 pages.

US Receiving Office, International Preliminary Report on Patentability, in PCT/US2009/01432, Sep. 7, 2010, 6 pages.

US Patent and Trademark Office, Office Action regarding U.S. Appl. No. 12/397,846, dated Jun. 20, 2011, 18 pages.

US Patent and Trademark Office, Office Action regarding U.S. Appl. No. 12/397,873, dated Nov. 16, 2011, 13 pages.

US Patent and Trademark Office, Office Action regarding U.S. Appl. No. 12/397,863, dated Jan. 10, 2012, 13 pages.

US Receiving Office, International Search Report and Written Opinion of the International Searching Authority, in PCT/US2009/001428, Mar. 5, 2012, 9 pages.

US Patent and Trademark Office, Office Action regarding U.S. Appl. No. 12/397,899, dated Mar. 8, 2012, 14 pages.

US Receiving Office, International Preliminary Report on Patentability, in PCT/US2009/001428, Apr. 11, 2012, 8 pages.

Aug. 4, 2015, Extended European Search Report from the European Patent Office, in European Patent Application No. 09717247.2, which is a foreign patent application that shares the same priority as this U.S. application.

Sep. 27, 2012, Office action from the U.S. Patent and Trademark Office, in U.S. Appl. No. 12/397,899, which is another application of Applicant Hanergy Hi-Tech Power (HK) Limited.

Jun. 18, 2013, Office action from the U.S. Patent and Trademark Office, in U.S. Appl. No. 12/397,899, which is another application of Applicant Hanergy Hi-Tech Power (HK) Limited.

Mar. 11, 2014, Office action from the U.S. Patent and Trademark Office, in U.S. Appl. No. 12/397,899, which is another application of Applicant Hanergy Hi-Tech Power (HK) Limited.

May 26, 2014, Office action from the Japanese Patent Office, in Japanese Patent Application No. 2010-549668, which is a foreign patent application that shares the same priority as this U.S. application.

Dec. 8, 2014, Office action from the Japanese Patent Office, in Japanese Patent Application No. 2010-549668, which is a foreign patent application that shares the same priority as this U.S. application.

Feb. 13, 2015, Office action from the U.S. Patent and Trademark Office, in U.S. Appl. No. 12/397,899, which is another application of Applicant Hanergy Hi-Tech Power (HK) Limited.

Japan Patent Office, Office action regarding Japanese Patent Application No. 2010-549668, Jun. 18, 2013, 6 pages.

Japan Patent Office, Office action regarding Japanese Patent Application No. 2010-549667, Jun. 18, 2013, 6 pages.

* cited by examiner

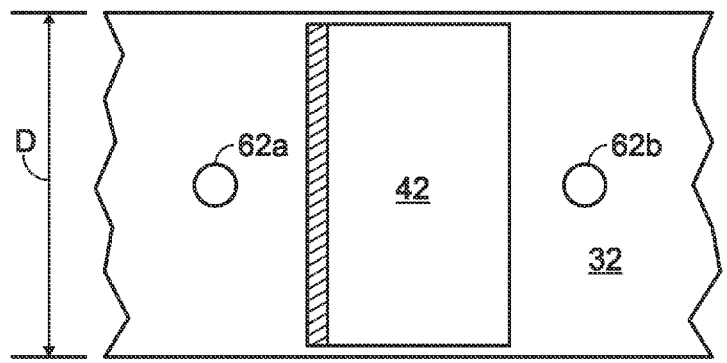
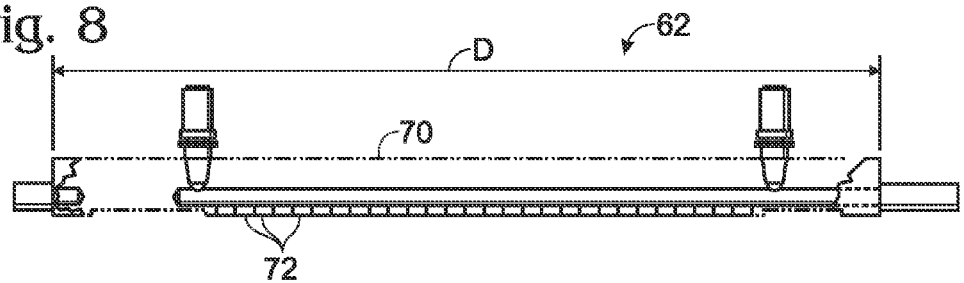
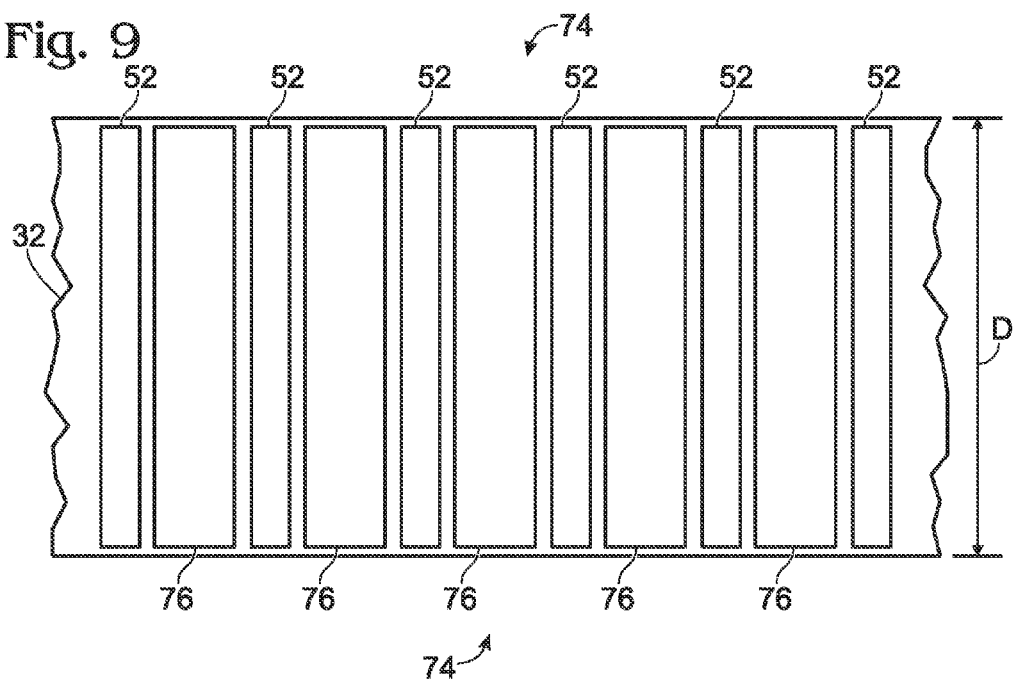

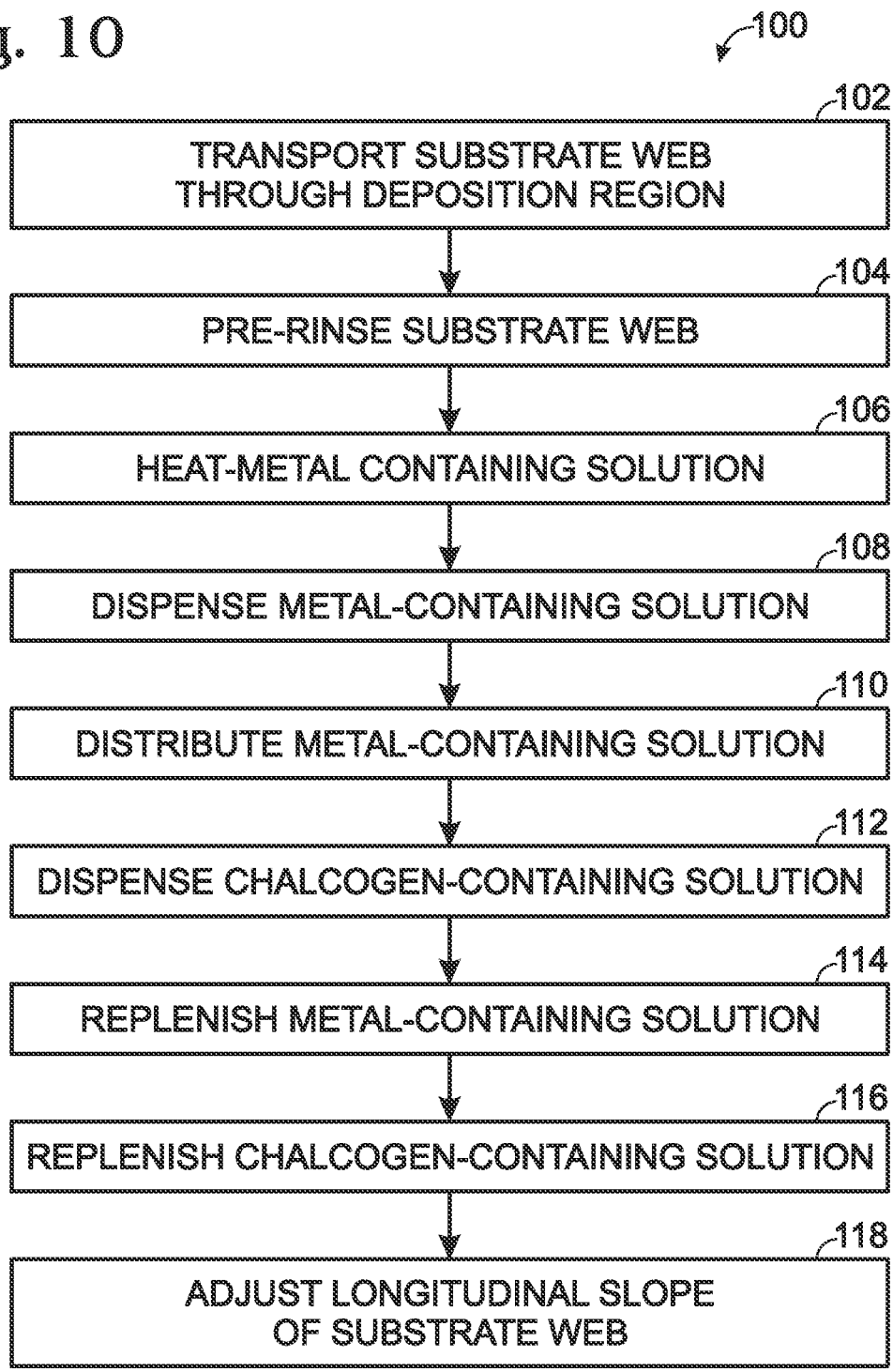

BUFFER LAYER DEPOSITION FOR THIN-FILM SOLAR CELLS

CROSS-REFERENCE TO RELATED APPLICATION

This application is a continuation of Ser. No. 12/397,846 filed Mar. 4, 2009 which claims priority under 35 U.S.C. §119 and applicable foreign and international law of U.S. Provisional Patent Application Ser. No. 61/068,459, filed on Mar. 5, 2008, which is hereby incorporated by reference in its entirety.

BACKGROUND

The field of photovoltaics generally relates to multi-layer materials that convert sunlight directly into DC electrical power. The basic mechanism for this conversion is the photovoltaic (or photoelectric) effect, first correctly described by Einstein in a seminal 1905 scientific paper for which he was awarded a Nobel Prize for physics. In the United States, photovoltaic (PV) devices are popularly known as solar cells. Solar cells are typically configured as a cooperating sandwich of p-type and n-type semiconductors, in which the n-type semiconductor material (on one "side" of the sandwich) exhibits an excess of electrons, and the p-type semiconductor material (on the other "side" of the sandwich) exhibits an excess of holes, each of which signifies the absence of an electron. Near the p-n junction between the two materials, valence electrons from the n-type layer move into neighboring holes in the p-type layer, creating a small electrical imbalance inside the solar cell. This results in an electric field in the vicinity of the junction.

When an incident photon excites an electron in the cell into the conduction band, the excited electron becomes unbound from the atoms of the semiconductor, creating a free electron/hole pair. Because, as described above, the p-n junction creates an electric field in the vicinity of the junction, electron/hole pairs created in this manner near the junction tend to separate and move away from junction, with the electron moving toward the n-type side, and the hole moving toward the p-type side of the junction. This creates an overall charge imbalance in the cell, so that if an external conductive path is provided between the two sides of the cell, electrons will move from the n-type side back to the p-type side along the external path, creating an electric current. In practice, electrons may be collected from at or near the surface of the n-type side by a conducting grid that covers a portion of the surface, while still allowing sufficient access into the cell by incident photons.

Such a photovoltaic structure, when appropriately located electrical contacts are included and the cell (or a series of cells) is incorporated into a closed electrical circuit, forms a working PV device. As a standalone device, a single conventional solar cell is not sufficient to power most applications. As a result, solar cells are commonly arranged into PV modules, or "strings," by connecting the front of one cell to the back of another, thereby adding the voltages of the individual cells together in electrical series. Typically, a significant number of cells are connected in series to achieve a usable voltage. The resulting DC current then may be fed through an inverter, where it is transformed into AC current at an appropriate frequency, which is chosen to match the frequency of AC current supplied by a conventional power grid. In the United States, this frequency is 60 Hertz (Hz), and most other countries provide AC power at either 50 Hz or 60 Hz.

One particular type of solar cell that has been developed for commercial use is a "thin film" PV cell. In comparison to other types of PV cells, such as crystalline silicon PV cells, thin film PV cells require less light-absorbing material to create a working cell, and thus can reduce processing costs. Thin film based PV cells also offer improved cost by employing previously developed deposition techniques widely used in the thin film industries for protective, decorative, and functional coatings. Common examples of low cost commercial thin film products include water permeable coatings on polymer-based food packaging, decorative coatings on architectural glass, low emissivity thermal control coatings on residential and commercial glass, and scratch and anti-reflective coatings on eyewear. Adopting or modifying techniques that have been developed in these other fields has allowed a reduction in development costs for PV cell thin film deposition techniques.

Furthermore, thin film cells, particularly those employing a sunlight absorber layer of copper indium diselenide, copper indium disulfide, copper indium aluminum diselenide, or copper indium gallium diselenide, have exhibited efficiencies approaching 20%, which rivals or exceeds the efficiencies of the most efficient crystalline cells. In particular, copper indium gallium diselenide (CIGS) is stable, has low toxicity, and is truly thin film, requiring a thickness of less than two microns in a working PV cell. As a result, to date CIGS appears to have demonstrated the greatest potential for high performance, low cost thin film PV products, and thus for penetrating bulk power generation markets.

Thin film PV materials may be deposited either on rigid glass substrates, or on flexible substrates. Glass substrates are relatively inexpensive, generally have a coefficient of thermal expansion that is a relatively close match with the CIGS or other absorber layers, and allow for the use of vacuum deposition systems. However, such rigid substrates suffer from various shortcomings, such as a need for substantial floor space for processing equipment and material storage, specialized heavy duty handling equipment, a high potential for substrate fracture, increased shipping costs due to the weight and delicacy of the glass, and difficulties in installation. As a result, the use of glass substrates is not optimal for large-volume, high-yield, commercial manufacturing of multi-layer functional thin film materials such as photovoltaics.

In contrast, roll-to-roll processing of thin flexible substrates allows for the use of compact, less expensive vacuum systems, and of non-specialized equipment that already has been developed for other thin film industries. PV cells based on thin flexible substrate materials also exhibit a relatively high tolerance to rapid heating and cooling and to large thermal gradients (resulting in a low likelihood of fracture or failure during processing), require comparatively low shipping costs, and exhibit a greater ease of installation than cells based on rigid substrates.

A particular type of n-type semiconductor material that may be used in thin-film PV cells is known in the field of chemistry as a chalcogenide. A chalcogenide is a chemical compound consisting of at least one chalcogen ion and at least one more electropositive element such as a metal. Forming a thin film of chalcogenide is described in the prior art, for example, in U.S. Pat. No. 6,537,845 to McCandless et al., which is hereby incorporated into the present disclosure by reference for all purposes. McCandless teaches dispensing a combined reactant solution onto a substrate, so that the substrate supplies the heat of reaction. Other prior art systems are known to be similar to the teachings of McCandless, with the additional feature of allowing an overall adjustment in the longitudinal slope of the substrate to control the rate of chalcogenide formation. However, forming chalcogenide films having a desired thickness and uniformity remains technically challenging, and further improvements are needed.

SUMMARY

The present teachings disclose improved methods and apparatus for forming thin-film layers of chalcogenide on a substrate web. According to the present teachings, solutions containing the reactants for the chalcogenide layer(s) may be dispensed separately to the substrate web or combined when reaching the web, rather than being mixed prior to their application. As a result, the heat of chalcogenide reaction may be supplied by one or more of the reactant solutions substantially without undesirable early nucleation and growth of chalcogenide.

BRIEF DESCRIPTION OF THE DRAWINGS

FIG. 7 is a partial schematic top view of the apparatus of FIG. 2, showing a solution spreader used to distribute solution across a transverse dimension of a substrate web.

FIG. 8 shows a solution dispenser configured to dispense a reactant solution onto a substrate web, according to aspects of the present disclosure.

FIG. 9 is a bottom view showing a portion of a substrate web including underlying heaters and rollers.

FIG. 10 is a flowchart depicting a method of depositing a chalcogenide buffer layer onto a flexible substrate.

DETAILED DESCRIPTION

I. Introduction

Figure 1:
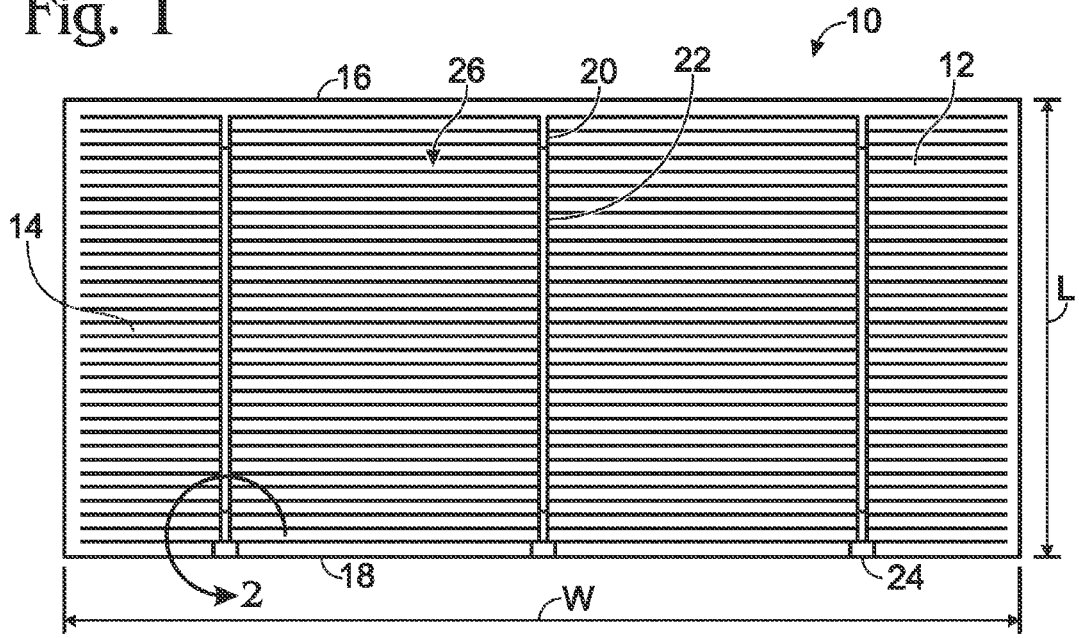
FIG. 1 is a top view of a thin-film photovoltaic cell, according to aspects of the present disclosure.

Manufacture of flexible thin-film PV cells may proceed by a roll-to-roll process. As compared to rigid substrates, roll-to-roll processing of thin flexible substrates allows for the use of relatively compact, less expensive vacuum systems, and of some non-specialized equipment that already has been developed for other thin-film industries. Flexible substrate materials inherently have lower heat capacity than glass, so that the amount of energy required to elevate the temperature is minimized. They also exhibit a relatively high tolerance to rapid heating and cooling and to large thermal gradients, resulting in a low likelihood of fracture or failure during processing. Additionally, once active PV materials are deposited onto flexible substrate materials, the resulting unlaminated cells or strings of cells may be shipped to another facility for lamination and/or assembly into flexible or rigid solar modules. This strategic option both reduces the cost of shipping (lightweight flexible substrates vs. glass), and enables the creation of partner-businesses for finishing and marketing PV modules throughout the world.

One or more of the layers deposited in a thin-film PV cell typically is a "window layer(s)" that allows usable light to penetrate to the interior of the cell, and which in some cases also may serve as the n-type semiconductor material in the cell. Such a layer also may be referred to in the PV cell field as a "buffer layer." When used both as a window layer and a semiconductor, the buffer layer ideally should be both substantially transparent to light in a desired wavelength range, and also exhibit the appropriate electronic properties. The buffer layer also could consist of multiple window layers acting also as semiconductors, such as a layer of cadmium sulfide followed by a layer of cadmium-zinc sulfide. A thin-film buffer layer with desired properties may be formed through chemical reaction between one or more metals such as zinc, cadmium, lead, mercury, or any metal or combination of metals selected from groups 1b, 2b, or 3a of the Periodic Table of the Elements, and a chalcogen such as oxygen, sulfur, selenium, or tellurium. The resulting compounds are often termed chalcogenides. Suitable window or buffer layer compounds for solar devices may include, for example, cadmium sulfide, zinc sulfide, zinc selenide, cadmium zinc selenide, zinc oxide, and cadmium zinc oxide.

Historically, the formation of a thin-film buffer layer or layers often proceeds by a relatively inefficient cyclical process that includes heating the substrates in a water-containing vessel to an elevated temperature, adding and mixing in a metallic salt, and then adding and mixing in a chalcogen-containing component. After a proscribed time at a proscribed temperature, the reaction is complete, the substrates are removed, the used solution is sent to waste treatment, reactant-containing solution is applied to the web, and the vessel is cleaned for the next reaction. In addition, existing methods of applying the reactant-containing solution to the web typically result in deposition of chalcogenide over both the desired ("front" or "top") surface of the web, and also over at least a portion of the other ("back" or "bottom") surface of the web, requiring at least one cleaning step to remove the material from the back surface. This is typically accomplished with an acidic solution that must be carefully controlled and completely removed to avoid damage to the desired thin-film layers and to avoid long-term corrosion issues activated by the presence of residual acidity. A sacrificial coating or covering for the back may also potentially be used to protect the backside from coverage, but such a coating requires additional cleanup and may result in excessive cost.

FIG. 1 shows a top view of a thin-film photovoltaic cell 10, in accordance with aspects of the present disclosure. Cell 10 is substantially planar, and typically rectangular as depicted in FIG. 1, although shapes other than rectangular may be more suitable for specific applications, such as for an odd-shaped rooftop or other surface. The cell has a top surface 12, a bottom surface 14 opposite the top surface, and dimensions including a length L, a width W, and a thickness. The length and width may be chosen for convenient application of the cells and/or for convenience during processing, and typically are in the range of a few centimeters (cm) to tens of cm. For example, the length may be approximately 100 millimeters (mm), and the width may be approximately 210 mm, although any other suitable dimensions may be chosen. The edges spanning the width of the cell may be characterized respectively as a leading edge 16 and a trailing edge 18. The total thickness of cell 10 depends on the particular layers chosen for the cell, and is typically dominated by the thickness of the underlying substrate of the cell. For example, a stainless steel substrate may have thickness on the order of 0.025 mm (25 microns), whereas all of the other layers of the cell may have a combined thickness on the order of 0.002 mm (2 microns) or less.

Cell 10 is created by starting with a flexible substrate, and then sequentially depositing multiple thin layers of different materials onto the substrate. This assembly may be accomplished through a roll-to-roll process whereby the substrate travels from a pay-out roll to a take-up roll, traveling through a series of deposition regions between the two rolls. The PV material then may be cut to cells of any desired size. The substrate material in a roll-to-roll process is generally thin, flexible, and can tolerate a relatively high-temperature environment. Suitable materials include, for example, a high temperature polymer such as polyimide, or a thin metal such as stainless steel or titanium, among others. Sequential layers typically are deposited onto the substrate in individual processing chambers by various processes such as sputtering, evaporation, vacuum deposition, chemical deposition, and/or printing. These layers may include a molybdenum (Mo) or chromium/molybdenum (Cr/Mo) back contact layer; an absorber layer of material such as copper indium diselenide, copper indium disulfide, copper indium aluminum diselenide, or copper indium gallium diselenide (CIGS); a buffer layer or layers such as a layer of cadmium sulfide (CdS); and a transparent conducting oxide (TCO) layer acting as the top electrode of the PV cell. In addition, a conductive current collection grid, usually constructed primarily from silver (Ag) or some other conductive metal, is typically applied over the TCO layer.

Although the precise thickness of each layer of a thin-film PV cell depends on the exact choice of materials and on the particular application process chosen for forming each layer, exemplary materials, thicknesses and methods of application of each layer described above are as follows, proceeding in typical order of application of each layer onto the substrate:

| Layer Description | Exemplary Material | Exemplary Thickness | Exemplary Method of Application |
| --- | --- | --- | --- |
| Substrate | Stainless steel | 25 μm | N/A (stock material) |
| Back contact | Mo | 320 nm | Sputtering |
| Absorber | CIGS | 1700 nm | Evaporation |
| Buffer | CdS | 80 nm | Chemical deposition |
| Front electrode | TCO | 250 nm | Sputtering |
| Collection grid | Ag | 40 μm | Printing |

The remainder of this disclosure focuses on various methods and apparatus for forming chalcogenide buffer layer(s).

II. Solution Application

This section describes particular methods of dispensing reactant solutions onto a PV cell web to form a buffer layer or layers on the web. According to aspects of the present disclosure, a buffer layer or layers may be applied to the underlying PV cell layers (typically a bottom substrate layer, one or more back contact layers, and an absorber layer) via a chemical deposition process. As shown schematically in FIGS. 2-6, the process involves an apparatus denoted as 30a-30e, respectively, for transporting a web 32 of thin-film substrate material through a deposition region 34, and dispensing one or more reactant solutions onto the web within the deposition region. The apparatus, which varies slightly in FIGS. 2-6, may generally be referred to as "apparatus 30," in which case it should be understood that the corresponding description refers to the common features of each apparatus 30a-30e.

Although the depicted embodiments transport the web linearly and in a direction corresponding to the longitudinal dimension of the web, the present teachings also contemplate alternative methods of depositing a thin film buffer layer. These alternatives include, for example, solution application onto a concave or convex web disposed on the inside or outside of a drum-like structure, and linear horizontal or near-horizontal web transport using one or a plurality of weirs (such as containers, plates, or rollers) held to a "controlled-drainage" distance from the web to hold the chalcogenide solution against the web for a suitable reaction period.

To react and form a suitable chalcogenide, the reactant solution should contain, at a minimum, at least one metal and at least one chalcogen, which are two of the components of a chalcogenide compound. In addition, the solution typically will contain a chemical complexant such as ammonia, and deionized water (DI). In some earlier generation roll-to-roll systems for chemically synthesizing a chalcogenide buffer layer, the metal (usually as a salt) and the chalcogen are combined into a single solution prior to application onto a substrate. This can lead to maintenance issues due to formation of chalcogenide layers within equipment such as the mixing vessel(s), the solution dispenser(s), and any conduits such as tubes or pipes that connect the vessels to the dispensers. Furthermore, pre-mixing the reactants so that the chemical reaction starts prior to application can make it difficult to control the rate and extent of the reaction on the substrate.

Figure 2:
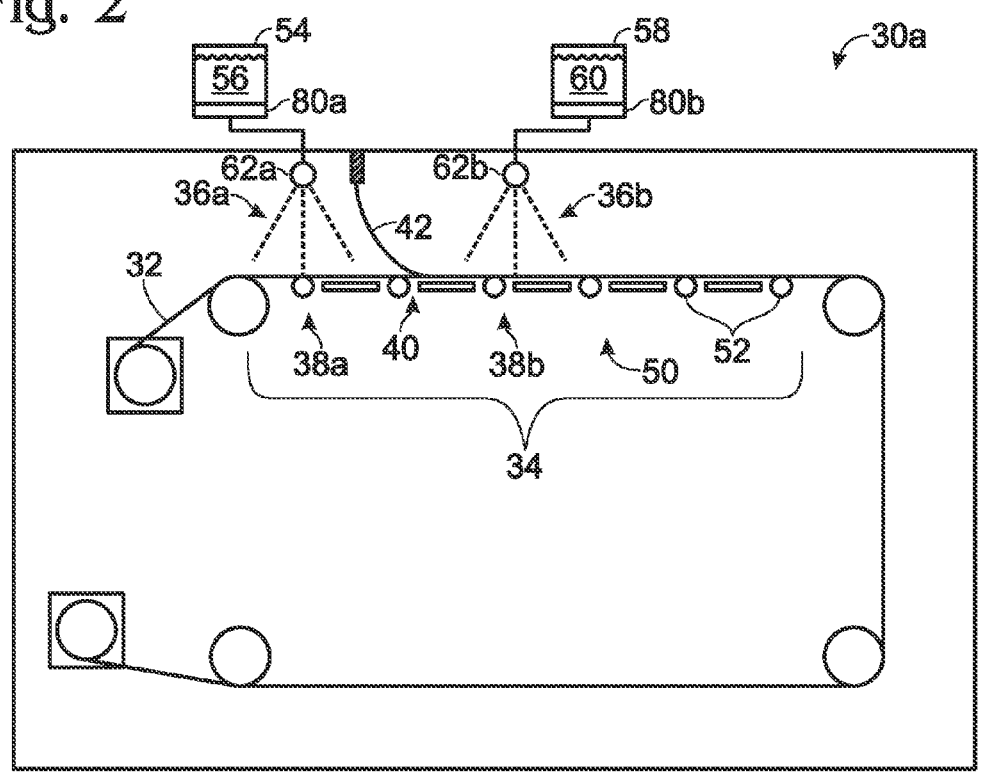
FIG. 2 is a schematic side view of an apparatus for forming a thin-film layer on a substrate web.

In contrast, according to the present teachings the metal-containing solution and the chalcogen-containing solution may be separately dispensed onto web 32, either at the same (or a nearby) position within the deposition region, or at two or more separate positions within the deposition region. Thus, as indicated in FIG. 2, a first solution 36a may be dispensed onto the web at a first position 38a within deposition region 34, and a second solution 36b may be dispensed onto the web at a second position 38b within the deposition region. In some embodiments, the first solution may be the chalcogen-containing solution and the second solution may be the metal-containing solution, and in other embodiments, the first solution may be the metal-containing solution and the second solution may be the chalcogen-containing solution.

Suitable metal-containing solutions may contain lead, and/or any group 1b, 2b, or 3a metal from the periodic table of the elements. For buffer layers, the typical metals, which include zinc, cadmium, lead, and mercury, often are prepared as a salt such as a sulfate, a chloride, a nitrate, an acetate, or some suitable variant. For example, cadmium sulfate may be an appropriate metallic salt. The salt typically is combined with a complexant such as ammonium hydroxide, and with deionized water. Suitable chalcogen-containing solutions may contain a chalcogen such as oxygen, sulfur, selenium, or tellurium, typically prepared as a reagent compound solution such as urea (an example of an oxygen-containing reagent) or thiourea (an example of a sulfur-containing reagent).

As depicted in FIGS. 2-5, first and second positions 38a, 38b within deposition region 34 may be longitudinally separated, with the second position located beyond the first position in the longitudinal direction. When the metal-containing solution is dispensed at the first position, the separation between the first and second positions may be chosen such that the second position is located beyond the first position by a sufficient distance to allow time for an ion exchange reaction between cadmium in the first solution and an underlying layer of photovoltaic material, in a region 40 between first position 38a and second position 38b. Such an ion exchange, also known as "surface exchange," may have beneficial effects upon the electronic properties of the underlying semiconductor layer (such as a CIGS layer) of the PV cell.

Initial application of a metal-containing solution for the purpose of surface exchange also may allow subsequent application of a second metal-containing solution, to form an alternative buffer layer or layers on the web. For example, as depicted in FIGS. 3-6, in variations of apparatus 30a denoted as 30b-30e, a third solution 36c including an alternative metal such as zinc may be dispensed onto the web at a third position 38c within the deposition region. The third position may be located either before the first position (as in FIG. 3), beyond the second position (as in FIGS. 4 and 6), or between the first and second positions (as in FIG. 5), in the longitudinal direction. In other words, the alternative metal-containing solution may be dispensed either before or after the chalcogen-containing solution and either before or after the other metal-containing solution used for surface exchange, to react with the chalcogen-containing solution and form a buffer layer or layers. In some cases, a buffer layer or layers may be formed that incorporates different metals from more than one metal-containing solution dispensed in series, one or more of which also may be used in a surface exchange reaction.

Alternatively, third solution 36c may be a metal-containing solution substantially similar to solution 36a, in which case the application of two portions of similar metal-containing solution may serve to replenish the metal used for chalcogenide formation on the substrate web. Similarly, third solution 36c may be a chalcogen-containing solution substantially similar to solution 36b, in which case the application of two portions of similar chalcogen-containing solution may serve to replenish the chalcogen used for chalcogenide formation on the substrate web. Of course, additional portions of both metal-containing and chalcogen-containing solutions may be applied to the substrate.

Figure 6:
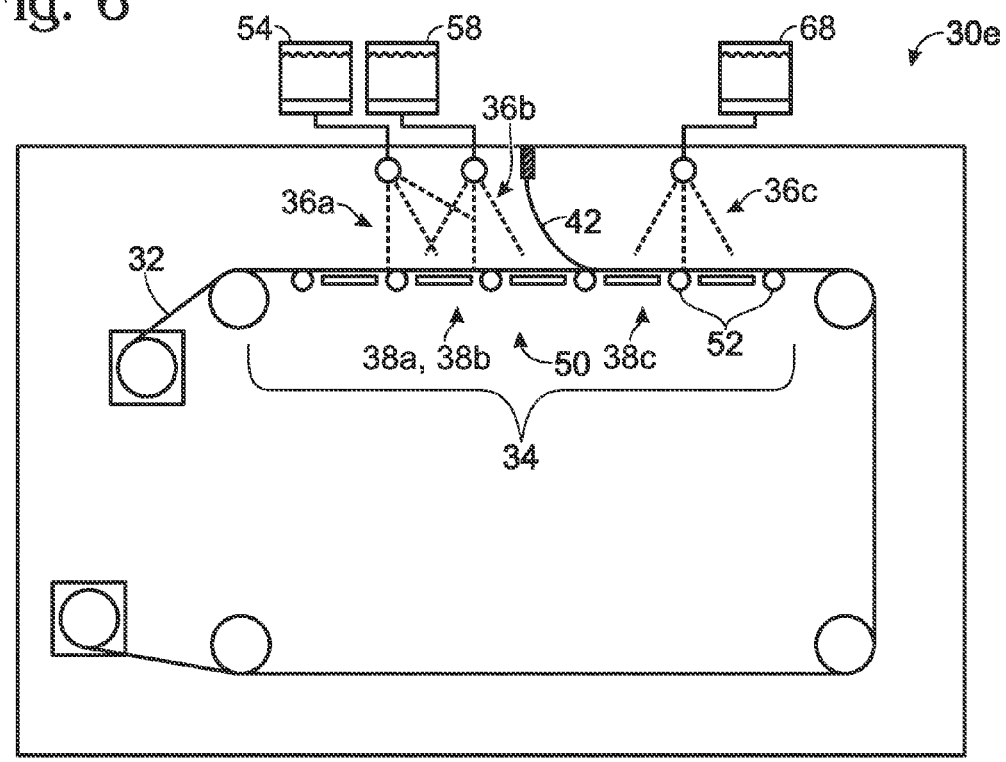
FIG. 6 is a schematic side view of another apparatus for forming a thin-film layer on a substrate web.

As seen in FIG. 6, first and second positions 38a, 38b may be substantially coincidental in the longitudinal direction, i.e. the initial portions of the metal-containing and chalcogen-containing solutions 36a, 36b may be dispensed at substantially the same longitudinal position on the substrate web. In this case, third solution 36c still may be dispensed at a third location 38c. The third solution may serve to replenish either of solutions 36a or 36b, or it may contain an additional reactant chosen to affect the rate of chalcogenide formation. It should be appreciated that multiple additional solutions may be dispensed after the initial solutions are dispensed, in which case the additional solutions may replenish both the metal-containing and the chalcogen-containing solutions. It should also be appreciated that if the third solution 36c contains a metal, such as zinc, which is chosen to induce a surface ion exchange reaction, then the third region 38c in which this solution is dispensed may be disposed at a longitudinal position (not shown in FIG. 6) on the substrate web before the mutual position where solutions 36a and 36b are dispensed.

In some instances, a complexant such as ammonium hydroxide ($NH_4OH$) may be dispensed separately from the metal-containing and chalcogen-containing solutions, at one or more suitable longitudinal positions within the deposition region. Alternatively, a complexant such as ammonia ($NH_3$) may be dispensed onto the web as a gas at any desired positions along the web. If dispensed as a gas, the ammonia may be dispensed through a dispenser such as those used for dispensing the liquid reactants, or it may be dispensed through a gas diffuser disposed near the surface of the substrate web. The gaseous complexant may in this manner be dispensed to diffuse over the top of any previously dispensed reactant solutions, to trigger the chalcogenide-forming reaction at a desired time and location on the web.

Figure 3:
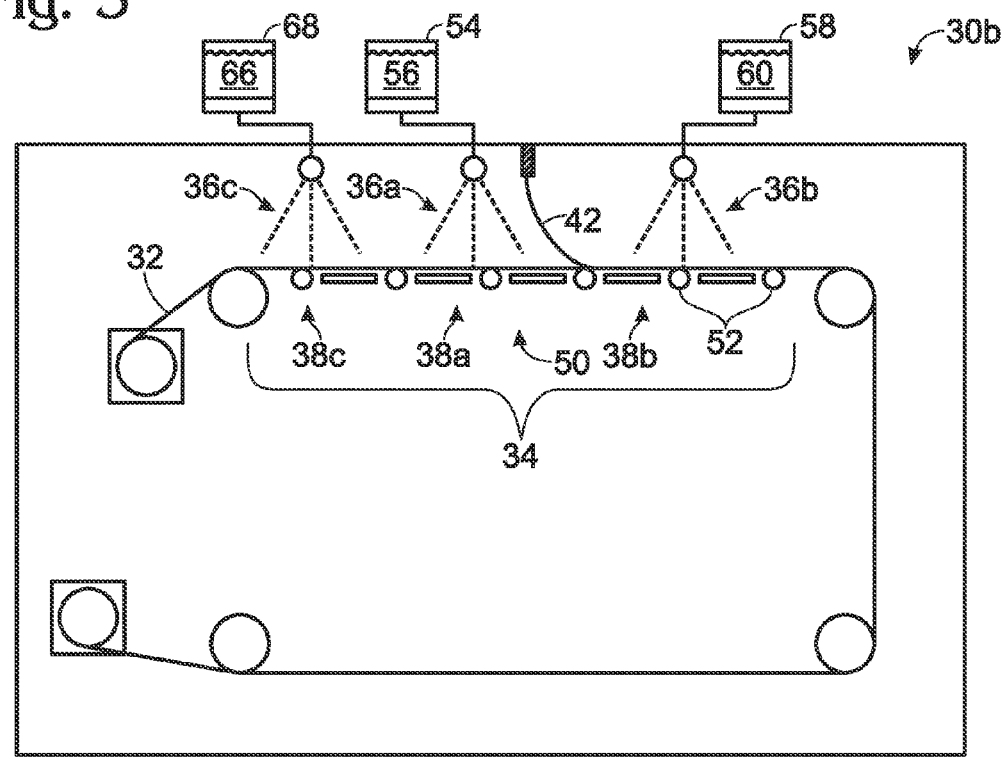
FIG. 3 is a schematic side view of another apparatus for forming a thin-film layer on a substrate web.

As seen in FIGS. 2-7, to facilitate uniform formation of a buffer layer, the metal-containing solution and/or the chalcogen-containing solution may be distributed across a transverse dimension D of web 32. As depicted in FIGS. 2, 4, 5 and 7, this distribution may be performed for one of the solutions, before the other solution(s) are dispensed, or as depicted in FIGS. 3 and 6, it may be performed after more than one (or all) of the solutions have been dispensed, or it may not be performed at all. Various methods of distributing solution may be utilized, such as passing the solution on the web under a solution spreader 42 of some sort. One type of suitable solution spreader is a sheet of polymer film, constructed from a material such as polyethylene terephthalate (PET), and disposed substantially across transverse dimension D of the web. As indicated in FIGS. 2-6, polymer film solution spreader 42 may be suspended from a position above the substrate web, to hang down toward the surface of the web and distribute a solution or a combination of solutions disposed on the web. Another method for improved dispersion and uniformity may be the use of a wetting agent, which may either be added to one or more of the solutions to be dispersed, or applied to the web prior to application of one or more of the solutions. Yet another method is to apply air jets or ultrasonic waves to the solutions, which may improve mixing and uniformity in the deposition region. Still another method of improving solution dispersion is to periodically tilt the web laterally from side-to-side in the deposition region or to use "bumpers" to bump the web from underneath in the deposition region. These various dispersion methods can be used in any desired combinations.

Apparatus 30 includes a transport mechanism, generally indicated at 50, for conveying a continuous flexible web of substrate material through the deposition region in the longitudinal region. Transport mechanism 50 may take various forms, such as one or more continuous belts that may convey the web while supporting it either from above or below, or a series of rollers, such as 16 or more, upon which the web rests and is conveyed. FIG. 2 depicts a transport mechanism that includes a plurality of synchronized transport rollers 52. Rollers 52 may be substantially evenly spaced, as shown in FIG. 2, or they may be unevenly spaced to accommodate other desired elements of the apparatus. To ensure that the web is transported through the deposition region at a uniform speed along its length, rollers 52 may be synchronized by any suitable method. For example, the rollers all may be driven by a single rotating shaft, with each roller linked to the common shaft. The rollers may be linked to the shaft by a standard gear/screw linking mechanism (not shown) or by any other linking mechanism. In an alternative embodiment, the support rollers may not rotate at all, but rather may be stationary, low-friction surfaces.

Rollers 52 may be precision leveled cross pieces, and each (or just some) of the rollers may include a vertical adjustment to allow them to be leveled to a desired precision. Alternatively, rather than always remaining leveled, one or more of rollers 52 may be adjusted to slightly different vertical positions, in which case the rollers may be viewed as a slope adjustment mechanism configured to adjust the longitudinal slope of the substrate web within at least a portion of the solution deposition region. Adjusting the slope of the web in this manner alters the flow rate of solution over the corresponding portion of the web, which affects the rate of chalcogenide formation and thus the thickness of the chalcogenide layer formed by the apparatus. The slope adjustment mechanism may be preset to give the web a predetermined slope in each portion of the deposition region, or it may be used to adjust the chalcogenide deposition rate during operation of the apparatus, for instance in response to thickness measurements made during operation.

Apparatus 30 also may include various supplies of the reactant solutions, which may be contained in various supply vessels for mixing, storing, and/or providing the various solutions dispensed on the substrate web. For example, FIG. 2 depicts a first supply vessel 54 containing a supply 56 of a metallic salt solution such as a cadmium salt solution, and a second supply vessel 58 containing a supply 60 of a chalcogen solution such as a thiourea solution. A plurality of additional supply vessels also may be provided, such as a vessel containing a supply of an alternative metallic solution, a vessel containing a supply of ammonium hydroxide or another suitable complexant solution, and a vessel containing a supply of deionized water. Alternatively, two or more of these solutions may be combined within a single supply vessel, and any or all of the solution may be provided from a source external to apparatus 30. Each of the supply vessels may be constructed in any suitable manner and from any suitable materials, provided the vessels are resistant to corrosion by the chemical compound or mixture of compounds they are intended to contain.

The various solutions described above may be applied (or dispensed) onto the web by solution dispensers in fluid communication with one or more associated supply vessels. For example, as depicted in FIG. 2, a first solution dispenser 62a may be configured to dispense a metal-containing solution 36a such as a cadmium salt solution from supply 56 onto the web at a first longitudinal position 38a, and a second solution dispenser 62b may be configured to dispense a chalcogen-containing solution 36b such as thiourea from supply 60 onto the web at a second longitudinal position 38b. One or more additional solution dispensers, not shown, may be configured to dispense additional solutions such as ammonium hydroxide and/or deionized water, or alternatively, the ammonium hydroxide and/or deionized water may be combined with the cadmium salt solution (or other metal-containing solution) and then dispensed together. The various dispensers may be angled (or include angled apertures, nozzles, or the like) to dispense solutions in any desired direction, such as along the length of the web and/or across the width of the web, as may be appropriate for directing the flow of reactant solutions to attain the desired thickness and uniformity of the chalcogenide buffer layer.

As described previously and depicted in FIGS. 3-6, one or more additional solution dispensers may be used to dispense additional amounts of metal-containing solution (which can be substantially similar to metal salt 36a, or which can contain a different metal) and/or chalcogen-containing solution. For example, as depicted in FIG. 3, when a first metal-containing solution is dispensed to allow for a surface exchange reaction with an underlying semiconductor layer and an alternative metal-containing solution is dispensed to form a buffer layer, a third dispenser 62c may be configured to dispense the alternative metal-containing solution 64c from an additional supply 66, which may be contained in a third supply vessel 68, onto the web. Alternatively, as depicted in FIG. 5, solution 36c configured to promote surface exchange may be dispensed at a longitudinal position 38c that lies between positions 38a and 38b where the chalcogenide components are dispensed.

Figure 4:
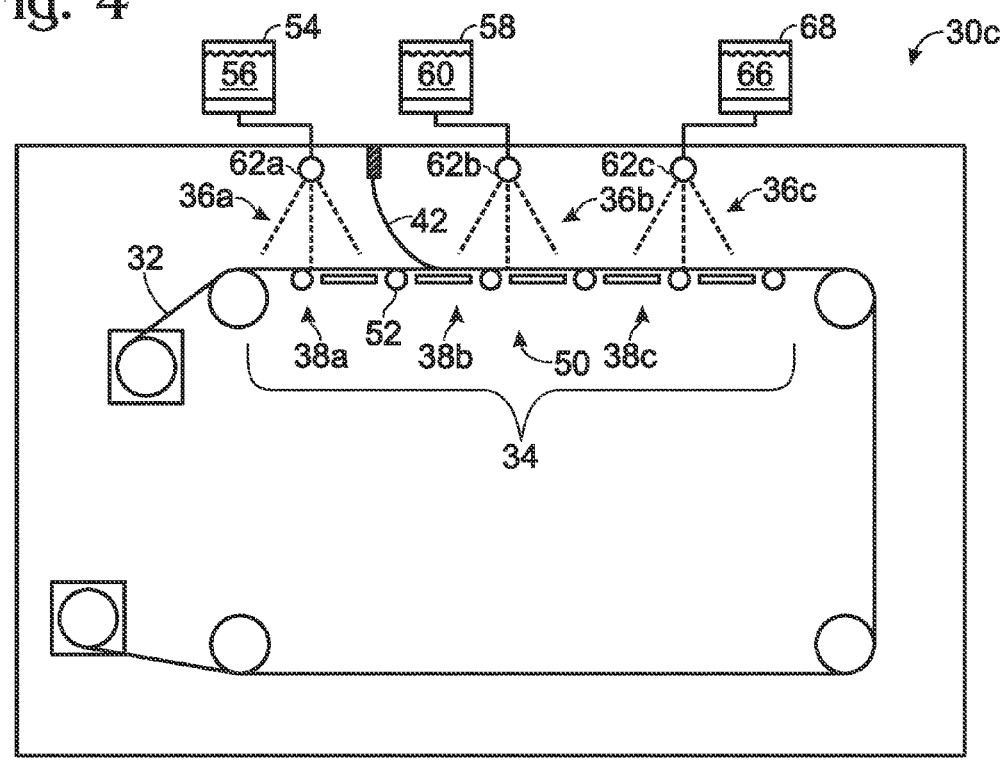
FIG. 4 is a schematic side view of another apparatus for forming a thin-film layer on a substrate web.
Figure 5:
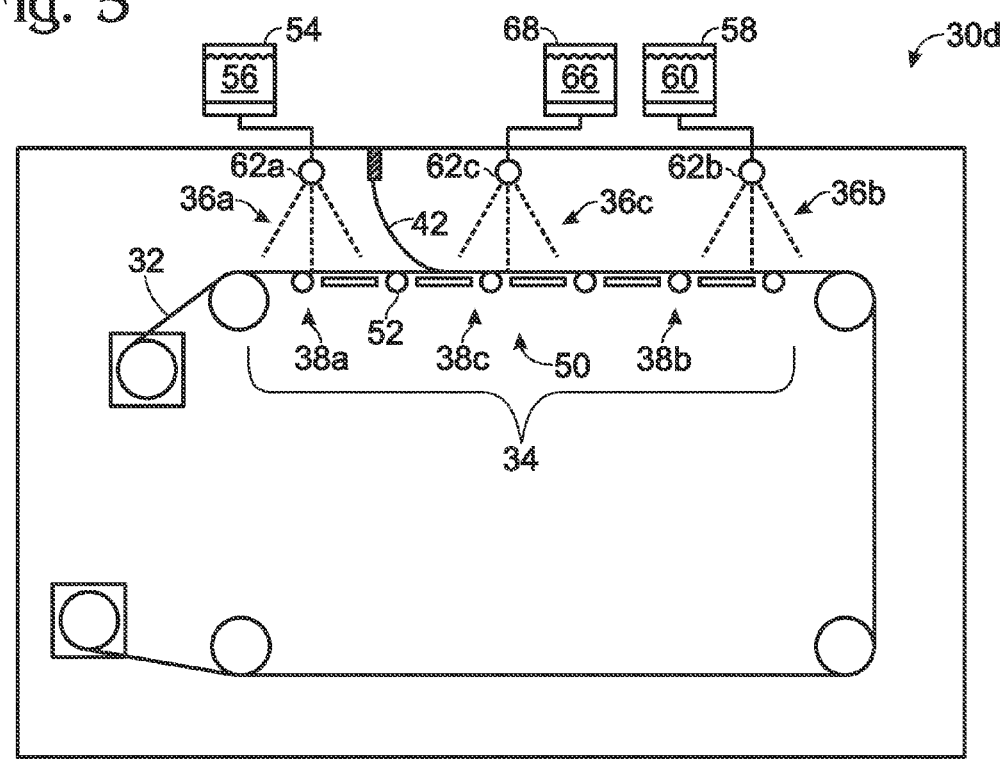
FIG. 5 is a schematic side view of another apparatus for forming a thin-film layer on a substrate web.

FIGS. 4 and 6 depict systems in which a third solution 36c is dispensed at a third longitudinal position 38c that lies beyond positions 38a, 38b where chalcogenide components 36a, 36b are dispensed onto the web. In these systems, solution 36c may serve to replenish the metal salt solution available for reaction into chalcogenide, in which case the third solution may be substantially similar or identical to metal-containing solution 36a. Alternatively, solution 36c may serve to replenish the chalcogen solution available for reaction into chalcogenide, in which the third solution may be substantially similar or identical to chalcogen-containing solution 36b. Solution 36c also may serve to replenish the chemical complexant, such as ammonium hydroxide, available for reaction. Furthermore, solution 36c may represent ammonia gas dispensed or diffused onto the web to replenish ammonia used in the reaction. The distinction between FIG. 4 and FIG. 6 is that in FIG. 4, metal salt solution 36a and chalcogen solution 36b are dispensed at substantially different positions 38a and 38b, whereas in FIG. 6, positions 38a and 38b are substantially coincidental.

The solution dispensers typically will be disposed above the web, at longitudinal positions corresponding to the desired positions for applying the associated solutions. The dispensers may have any suitable construction allowing application of solution in a sufficiently uniform manner across the transverse dimension of the web and at a desired flow rate. For example, FIG. 8 depicts a solution dispenser 62 according to aspects of the present disclosure, which is suitable for use as solution dispensers 62a, 62b and 62c depicted schematically in FIGS. 2-6. As depicted in FIG. 8, a solution dispenser 62 may include a pressurized manifold 70 extending substantially across the transverse dimension D of the web and perforated with a plurality of apertures 72. More specifically, the depicted dispensers are designed to deliver uniform streams or droplets of solution across the web, due to a multiplicity of precision apertures placed in the body of the slightly pressurized applicator to form a manifold. The size and number of apertures may be adjusted to attain any desired solution flow for best uniformity.

For example, first dispenser 62a may include approximately 44 apertures (not specifically shown in FIG. 8), each with a diameter of approximately 0.020 inches, and second dispenser 62b may include approximately 23 apertures (also not shown), each also with a diameter of approximately 0.020 inches. Additional solution dispenser(s) 62c may be constructed similarly. Many methods can be used to create precision apertures in the dispensers, such as the use of screw-in tubes with precision inside diameters. Alternatively, dispensers according to the present teachings may include a plurality of nozzles, tips, or any other suitable dispensing structure, rather than apertures. Furthermore, instead of multiple apertures or nozzles, solution application could include a single stream of solution traversing back and forth across the transverse dimension of the web.

Because the chalcogenide-forming chemical reaction between a metal-containing solution and a chalcogen-containing solution typically requires a minimum temperature for a suitable reaction rate, one or more heaters may be provided to supply heat to the substrate web and/or to the solutions. For example, a heating mechanism, generally indicated at 74 in FIG. 6, may be configured to heat the web substantially uniformly in the deposition region. Web heating mechanism 74 may, for example, include a plurality of discrete heaters 76 for heating the web. The heaters may be disposed in any convenient position in proximity to the web, for example, they may be disposed below the web and between adjacent pairs of rollers 52. As depicted in FIG. 9, heaters 76 may extend substantially across the transverse dimension D of the web, to heat the web substantially uniformly. In addition, the heaters may be positioned out of physical contact with the web, to provide heat to the web substantially nonconductively. Heaters 76 may have independently adjustable temperatures, and may have adjustable edge-to-center temperature profiles for improved heating uniformity. Alternatively or in addition to heaters 76, various trim heaters (not shown) may be used to compensate for heat loss, thus optimizing temperature uniformity.

In some embodiments, solution application may be configured such that little or no heating of the web is required, aside from heating the web with the applied reactant solution(s). That is, if the metal-containing solution and/or the chalcogen-containing solution are sufficiently hot, then the mere combination of the solutions can substantially supply the heat of chalcogenide reaction. If heat losses are sufficiently controlled, the reaction can continue to substantial completion without any additional heating of the solutions or the web. This may be accomplished if one or both of metal-containing solution 56 and chalcogen-containing solution 60 are preheated, for example by heaters 80a and 80b depicted in FIG. 2. In some cases, both solutions 56 and 60 may be preheated to a temperature in excess of the web temperature, and their temperatures upon application to the web may be monitored by one or more infrared sensors (not shown). In such embodiments, the temperature of the web may be monitored at any or all positions both prior and subsequent to application of each solution. This may, for example, allow the second solution dispensed (chalcogen-containing solution 60 in FIG. 2) to be preheated to a temperature greater than the temperature of the web after application of the first solution dispensed. In some cases, multiple feeds of the same (or a similar) solution could occur at different temperatures. In this manner, one could create an optimal temperature profile by carefully choosing the positions of the various dispensers and the temperatures of the solutions to attain the desired profile.

In some instances, just one of the reactant solutions may substantially supply the heat of chalcogenide reaction. For instance, metal-containing solution 56 may be heated by heater 80a to a high enough temperature to induce chalcogenide formation even when combined with a significantly cooler chalcogen solution on a significantly cooler substrate web. It has been found, for example, that if solution 56 is heated to a temperature in the range from 55-70 degrees Celsius, dispensed metal-containing solution 36a will have approximately this same temperature. Due to the relatively low heat capacity of the substrate web, when heated solution 36a contacts the web, the web quickly attains virtually the same temperature as solution 36a even if the web was previously at a temperature of only 25-45 degrees Celsius. This may be sufficient to induce a desired degree of chalcogenide formation even if chalcogen solution 36b is dispensed onto the web at room temperature (or a slightly elevated temperature due to the system operating conditions). Heaters 76 (see FIG. 9) then may not be used at all, or may be used merely to maintain a desired operating temperature rather than supplying the heat of chalcogenide reaction. By dispensing solutions 36a and 36b either separately or simultaneously from separate supplies, undesirable premature chalcogenide nucleation can still be avoided even though the solutions themselves supply the heat of reaction.

Figure 12:
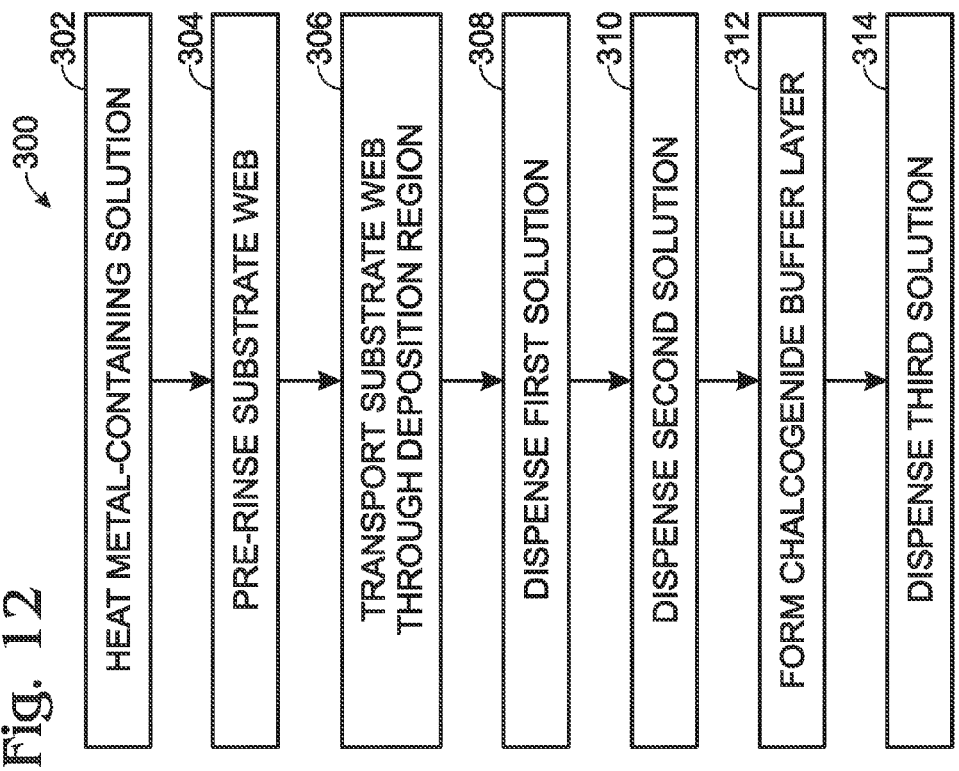
FIG. 12 is a flowchart depicting another method of depositing a chalcogenide buffer layer onto a flexible substrate.
Figure 11:
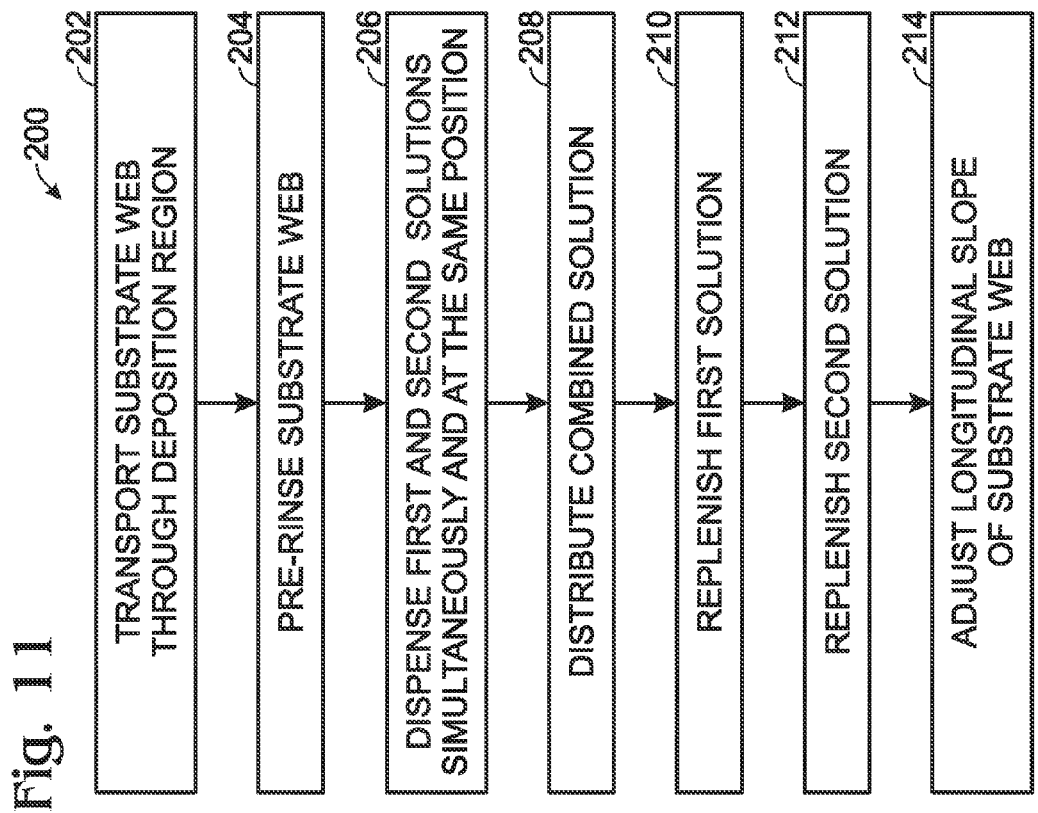
FIG. 11 is a flowchart depicting another method of depositing a chalcogenide buffer layer onto a flexible substrate.

FIGS. 10-12 depict methods of depositing a thin-film chalcogenide buffer layer onto a flexible substrate according to aspects of the present teachings. FIG. 10 depicts a first such method, generally indicated at 100. At step 102, a web of thin-film substrate material is transported through a deposition region in a longitudinal direction. As described above, the substrate material may include a base substrate, such as a thin sheet of stainless steel, upon which one or more thin-film layers have already been deposited. For example, a back contact layer constructed from a material such as molybdenum, and a p-type absorber layer constructed from a material such as CIGS, may already have been deposited on the base substrate. It should be understood that the substrate web may include these layers when it is transported through the deposition region. The web will generally be transported in a roll-to-roll or other similar process, in which case the longitudinal direction will be the direction of travel between the pay-out roll and the take-up roll.

At step 104, the substrate web is rinsed with deionized water or some other suitable solution. This rinsing step may be referred to as "pre-rinsing" because it is generally performed prior to application of the chalcogenide-forming solutions to the web. The pre-rinsing step may remove surface irregularities or other artifacts left over from a prior deposition process (such as CIGS deposition), and thus provide a relatively more consistent surface for chalcogenide deposition. In some cases, the rinsing solution may be heated, and/or a second rinsing step may be performed to rinse the first rinsing solution from the web in preparation for chalcogenide formation.

At step 106, a metal-containing solution is heated. This solution contains a metal known to react with a chalcogen to form chalcogenide, and thus will generally be selected from the group consisting of copper, silver, gold, zinc, cadmium, mercury, lead, boron, aluminum, gallium, indium, and thallium. The metal-containing solution is heated to a temperature sufficient to provide at least a substantial portion of the heat of reaction for chalcogenide formation on the web. Accordingly, the temperature of the metal-containing solution will generally be greater than the temperature of the moving web (prior to application of the solution). For example, the metal-containing solution may be heated to a temperature in the range of 55-70 degrees Celsius, whereas prior to application of the solution, the web may have a temperature in the range of 25-45 degrees Celsius.

At step 108, the metal-containing solution is dispensed onto the web at a first longitudinal position within the deposition region. The solution may be dispensed by a dispenser similar to one of dispensers 62 described previously, but it should be appreciated that any suitable means of dispensing a solution (or in the case of NH3, a gas) falls within the scope of the present teachings. At step 110, the metal-containing solution may be distributed across the transverse dimension of the web by passing the solution under a solution spreader such as spreader 42 depicted in FIGS. 2-7. As noted above, distributing the metal-containing solution in this manner can lead to formation of a more uniform chalcogenide layer. However, it should be appreciated that distributing the metal-containing solution may be accomplished through other means and may be omitted entirely as a separate step, in cases where a sufficiently uniform solution distribution is achieved simply through dispensing the solution appropriately.

At step 112, a chalcogen-containing solution is dispensed onto the web at a second longitudinal position within the deposition region. This solution contains a chalcogen selected from the group consisting of oxygen, sulfur, selenium and tellurium, and which is known to react with the metal in the metal-containing solution to form a chalcogenide with desired optical and/or electronic properties. One exemplary combination is for cadmium to combine with sulfur to produce cadmium sulfide, but other chalcogenides may be suitable as buffer layers and/or n-type semiconductor layers. It should be appreciated that step 112, dispensing the chalcogen solution, may be performed before step 110, distributing the metal-containing solution. In this case, both solutions may be distributed by the solution spreader.

It should also be appreciated that the metal-containing solution and the chalcogen-containing solution may be dispensed at any two desired positions within the deposition region. For example, the second position (at which the chalcogen-containing solution is dispensed) may be disposed beyond the first position (at which the metal-containing solution is dispensed) by a sufficient distance in the longitudinal direction, such as one inch or more, to allow appreciable surface ion exchange between the metal in the metal-containing solution and an underlying layer of photovoltaic material, in a region between the first position and the second position. This may have beneficial effects upon the electronic properties of the underlying semiconductor layer (such as a CIGS layer) of the PV cell. Alternatively, the first and second positions may be substantially coincidental, i.e. the metal-containing solution and the chalcogen-containing solution may be dispensed at substantially the same longitudinal position on the substrate web.

In steps 114 and 116, the metal-containing solution and/or the chalcogen-containing solution may be replenished by dispensing one or more additional solutions on the web at additional longitudinal positions. For example, an additional amount of metal-containing solution may be dispensed at a third longitudinal position to replenish the metal-containing solution used in the chalcogenide reaction, and/or an additional amount of chalcogen-containing solution may be dispensed at a third longitudinal position to replenish the chalcogen-containing solution used in the chalcogenide reaction. It should be understood that one or more solution spreaders may be used to distribute these additional solutions on the web. Further, an alternate metal-containing solution, such as a zinc-containing solution, may be dispensed at a third longitudinal position in step 114, to facilitate surface ion exchange with the underlying semiconductor layer. This metal-containing solution may be applied either before or after application of one or both of the other solutions or gases.

At step 118, a longitudinal slope of the substrate web is adjusted. This step may allow for the formation of a chalcogenide layer of desired thickness, by allowing control of the speed of solution flow over the web, which in turn influences the amount of reaction time available for chalcogenide formation. The slope of the substrate may be adjusted globally (i.e., throughout the entire deposition region), as in some previous chalcogenide deposition systems, or it may be adjusted separately within sections of the deposition region. For instance, it may be desirable to retain solutions depleted of their metal and chalcogen contents on the web for a longer period of time than undepleted solutions, to provide an approximately uniform or otherwise desirable chalcogenide deposition rate. Furthermore, it may be desirable to increase the web slope progressively as additional solutions are dispensed onto the web, to maintain an approximately uniformly thick solution layer on the web. In any case, the longitudinal slope may be adjusted, for example, by adjusting the relative heights of the rollers or other elements that support and/or transport the substrate web through the deposition region.

FIG. 11 depicts a second method, generally indicated at 200, of depositing a thin-film chalcogenide buffer layer onto a flexible substrate. At step 202, a web of thin-film substrate material is transported through a deposition region in a longitudinal direction. As described above, the substrate material may include a base substrate, such as a thin sheet of stainless steel, upon which one or more thin-film layers have already been deposited. For example, a back contact layer constructed from a material such as molybdenum, and a p-type absorber layer constructed from a material such as CIGS, may already have been deposited on the base substrate. It should be understood that the substrate web may include these layers when it is transported through the deposition region. The web will generally be transported in a roll-to-roll or other similar process, in which case the longitudinal direction will be the direction of travel between the pay-out roll and the take-up roll.

At step 204, the substrate web may be rinsed with deionized water or some other suitable cleansing solution. This rinsing step may be referred to as "pre-rinsing" because it is generally performed prior to application of the chalcogenide-forming solutions to the web. The pre-rinsing step may remove surface irregularities or other artifacts left over from a prior deposition process (such as CIGS deposition), and thus provide a relatively more consistent surface for chalcogenide deposition. As noted previously, the rinsing solution may be heated, and/or a second rinse may be performed to remove traces of the initial rinsing solution. Alternatively or in addition, a surfactant solution may be employed as a rinsing solution, to bond with and disperse any surface irregularities and/or to decrease surface tension on the web.

At step 206, a metal-containing solution and a chalcogen-containing solution are dispensed onto the moving web, substantially simultaneously and substantially at the same longitudinal position on the web. The metal-containing solution contains a metal known to react with a chalcogen to form chalcogenide, and is generally selected from the group consisting of copper, silver, gold, zinc, cadmium, mercury, lead, boron, aluminum, gallium, indium, and thallium. The chalcogen-containing solution contains a chalcogen known to react with the metal in the metal-containing solution to form a chalcogenide with desired optical and/or electronic properties, and is generally selected from the group consisting of oxygen, sulfur, selenium and tellurium. The metal-containing and chalcogen-containing solutions (as well as any other solutions applied to the web) may be degassed prior to their application to the web.

According to the present teachings, either the metal-containing solution or the chalcogen-containing solution will be dispensed onto the web at a temperature greater then the temperature of the web prior to application of the solutions. Aside from the operating temperature of the system, which is generally in the range of 25-45 degrees Celsius, the heat of chalcogenide reaction will thus be supplied substantially be the applied solutions, although it should be appreciated that heaters may be used to maintain a desired reaction temperature after application of the solutions. However, because the metal-containing and chalcogen-containing solutions are applied separately, premature nucleation of chalcogenide is still avoided in method 200.

At step 208, the combination of the metal-containing solution and the chalcogen-containing solution may be distributed across a transverse dimension of the substrate web, such as a sheet of polymer film or by any other technique that homogenizes the transverse distribution of solution to some extent, giving rise to a more consistent chalcogenide layer thickness. At steps 210 and 212, one or both of the metal-containing solution and the chalcogen-containing solution may be replenished by dispensing onto the web, at a position beyond the position where the solutions are dispensed in step 206, one or more additional solutions. For example, at step 210 an additional metal-containing solution may be dispensed, containing either the same or a different metal as the metal in the solution of step 206, and at step 212 an additional chalcogen-containing solution may be dispensed, containing either the same or a different chalcogen as the chalcogen in the solution of step 206.

At step 214, the longitudinal slope of the substrate web may be adjusted as in step 118 of method 100. This slope adjustment may be predetermined based on calculation chalcogenide formation rates at different longitudinal positions along the web, or the slope adjustment may be performed in response to real-time measurements of chalcogenide layer thickness. In either case, the adjustment affects the rate of fluid flow over the web, and thus the rate of chalcogenide formation at each portion of the substrate.

FIG. 12 depicts a third method of depositing a thin-film chalcogenide buffer layer onto a flexible substrate, generally indicated at 300. In a first step 302 of method 300, a metal-containing solution is heated. The metal-containing solution will be capable of combining with a chalcogen to form a chalcogenide, and accordingly will by chosen from the group consisting of copper, silver, gold, zinc, cadmium, mercury, lead, boron, aluminum, gallium, indium, and thallium. The metal-containing solution will be heated to a sufficient temperature to substantially provide the heat of reaction for chalcogenide formation, typically 55-75 degrees Celsius.

At step 304, a substrate web is prepared for chalcogenide deposition by pre-rinsing, typically with deionized water. It should be appreciated that this step can be performed before or after heating step 302. As in methods 100 and 200, the substrate web may include not only a base substrate layer such as a thin layer of stainless steel, but also a back contact layer and a p-type semiconductor absorber layer. At step 306, the substrate web is transported through a solution deposition region, as has previously been described. At step 308, the metal-containing solution is dispensed onto the moving substrate web, and at step 310, a chalcogen-containing solution generally including a chalcogen selected from the group consisting of oxygen, sulfur, selenium and tellurium is dispensed onto the moving substrate web.

In method 300, the metal-containing and chalcogen-containing solutions may be dispensed at substantially the same longitudinal position within the deposition region of the substrate web, or the two solutions may be dispensed at different longitudinal positions such that the longitudinal distance between the first and second positions is sufficient to allow appreciable ion exchange between the metal in the metal-containing solution and the underlying layer of p-type absorber material prior to dispensing the chalcogen-containing solution. In either case, a chalcogenide buffer layer is formed on the substrate web at step 312, with the heat of reaction for chalcogenide formation substantially provided by the heated metal-containing solution. However, it should be appreciated that some heat will also be provided by the operating temperature of the surrounding chamber, and that heat may be provided to maintain a desired chalcogenide reaction temperature.

At step 314, a third solution is dispensed at a longitudinal position different from the position(s) where the metal-containing and chalcogen-containing solutions were previously dispensed in steps 308 and 310. This third solution may be another portion of metal-containing solution substantially similar to the solution dispensed in step 308, in which case it may serve to replenish the metal that reacts to form chalcogenide. Alternatively the third solution may be a metal-containing solution substantially different from the solution of step 308, in which case it may serve to provide an alternate metal for surface ion exchange. As a third alternative, the solution of step 314 may be a chalcogen-containing solution substantially similar to the solution dispensed at step 310, in which case it may serve to replenish the chalcogen that reacts to form chalcogenide on the web. As a fourth alternative, the solution of step 314 may be a solution containing ammonium hydroxide, or step 314 may include gaseous dispensation of ammonia at one or more various locations along the length of the substrate web, to compensate for a decrease in ammonia concentration as the chalcogenide-forming reaction proceeds.

It should be appreciated that in methods 100, 200 and 300 depicted in FIGS. 10-12, not every step is required according to the present teachings. More specifically, a minimal method involves only transporting a substrate web through a deposition region and dispensing metal-containing and chalcogen-containing solutions onto the web to form a chalcogenide buffer layer. The remaining steps, such as heating, distribution, replenishment, and slope adjustment, may be applied in particular embodiments, to deposit chalcogenide layers having various desired attributes. Furthermore, additional steps may be beneficially incorporated into these methods. For example, air, another suitable gas, or UV radiation may be applied to the surface of the web to promote annealing prior to pre-rinsing.

The disclosure set forth above may encompass multiple distinct inventions with independent utility. Although each of these inventions has been disclosed in its preferred form(s), the specific embodiments thereof as disclosed and illustrated herein are not to be considered in a limiting sense, because numerous variations are possible. The subject matter of the inventions includes all novel and nonobvious combinations and subcombinations of the various elements, features, functions, and/or properties disclosed herein. The following claims particularly point out certain combinations and subcombinations regarded as novel and nonobvious. Inventions embodied in other combinations and subcombinations of features, functions, elements, and/or properties may be claimed in applications aiming priority from this or a related application. Such claims, whether directed to a different invention or to the same invention, and whether broader, narrower, equal, or different in scope to the original numbered paragraphs that follow, also are regarded as included within the subject matter of the inventions of the present disclosure.

We claim:

1. A method of producing a flexible thin film photovoltaic material comprising:
    depositing a p-type absorber layer on a continuous length of flexible substrate;
    conveying continuously the flexible substrate through a deposition path; and
    forming an n-type layer on the p-type absorber layer by
        dispensing onto the p-type absorber layer, at a first longitudinal position along the path, a first solution containing cadmium, and
        dispensing onto the p-type absorber layer, at a second a longitudinal position along the path, a second solution containing a chalcogen selected from the group including oxygen, sulfur, and selenium;
        wherein the second position is located beyond the first position by a sufficient distance to allow time for an ion exchange reaction between cadmium in the first solution and the p-type absorber layer, in a region between the first position and the second position.

2. The method of claim 1, wherein the first solution includes cadmium sulfate.

3. The method of claim 1, wherein the second solution includes thiourea.

4. The method of claim 1, further comprising heating the first solution to a temperature greater than the temperature of the moving web prior to application of the first solution to the web.

5. The method of claim 4, wherein heating the first solution includes heating the first solution to a temperature in the range of 55-70 degrees Celsius, and wherein the temperature of the moving web prior to application of the first solution to the web is in the range of 25-45 degrees Celsius.

6. The method of claim 1, wherein the second position is disposed beyond the first position in the longitudinal direction.

7. The method of claim 1, further comprising dispensing onto the web, at a third longitudinal position disposed beyond the second position in the longitudinal direction, a third solution containing a metal selected from the group consisting of copper, silver, gold, zinc, cadmium, mercury, lead, boron, aluminum, gallium, indium, and thallium.

8. The method of claim 1, further comprising dispensing onto the web, at a third longitudinal position disposed beyond the second position in the longitudinal direction, a third solution containing a chalcogen selected from the group consisting of oxygen, sulfur, selenium, and tellurium.

9. The method of claim 1, further comprising dispensing onto the web, at a third longitudinal position disposed beyond the second position in the longitudinal direction, a third solution containing a chemical complexant.

10. The method of claim 1, further comprising rinsing the web to remove surface irregularities prior to dispensing either the first or second solution.

11. The method of claim 1, further comprising applying a surfactant to the web.

12. The method of claim 1, further comprising distributing the first solution across a transverse dimension of the web by passing the web under a solution spreader disposed substantially across the transverse dimension of the web.

13. The method of claim 1, further comprising separately adjusting a longitudinal slope of the web in a plurality of longitudinal regions when forming the n-type layer, such that the n-type layer forms a thin-film chalcogenide buffer layer of a desired thickness.

14. A method of producing a flexible thin film photovoltaic material comprising:
   depositing a p-type absorber layer on a continuous length of flexible substrate,
   conveying continuously the flexible substrate through a deposition path,
   forming an n-type cadmium sulfide layer on the p-type absorber layer by dispensing onto the p-type absorber layer at first and second respective locations along the path, a first solution containing cadmium sulfate, and a second solution containing thiourea to react forming a product comprising cadmium sulfide, and annealing the product to form a cadmium sulfide buffer layer on the p-type absorber layer;
   wherein the second location is located beyond the first location by a sufficient distance to allow time for an ion exchange reaction between cadmium in the cadmium sulfate and the p-type absorber layer, in a region between the first location and the second location.

15. The method of claim 14, wherein the p-type absorber layer comprises copper indium gallium diselenide.

16. The method of claim 14, further comprising the step of heating the first solution to a temperature in the range of approximately 55 to 75 degrees Celsius prior to the dispensing step.

17. A method of producing a flexible thin film photovoltaic material comprising:
   depositing a p-type absorber layer including copper indium gallium diselenide on a continuous length of flexible substrate,
   conveying continuously the flexible substrate through a deposition path,
   forming an n-type cadmium sulfide layer on the p-type absorber layer by separately dispensing cadmium sulfate and thiourea onto the p-type absorber layer at separate locations along the path, heating at least one of the cadmium sulfate and thiourea to a temperature in the range of approximately 55 to 75 degrees Celsius prior to the dispensing step, allowing the cadmium sulfate and thiourea to react forming a product comprising cadmium sulfide, and annealing the product to form a cadmium sulfide buffer layer on the p-type absorber layer.

* * * * *